United States Patent
Chu et al.

(10) Patent No.: US 9,601,348 B2
(45) Date of Patent: Mar. 21, 2017

(54) INTERCONNECT STRUCTURE AND METHOD OF FORMING SAME

(71) Applicant: Taiwan Semiconductor Manufacturing Company, Ltd., Hsin-Chu (TW)

(72) Inventors: Ming-Hui Chu, Taichung (TW); Chih-Yuan Ting, Taipei (TW); Jyu-Horng Shieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/209,836

(22) Filed: Mar. 13, 2014

(65) Prior Publication Data

US 2015/0262873 A1  Sep. 17, 2015

(51) Int. Cl.
| | |
|---|---|
| *H01L 23/58* | (2006.01) |
| *H01L 21/311* | (2006.01) |
| *H01L 23/522* | (2006.01) |
| *H01L 21/768* | (2006.01) |
| *H01L 23/532* | (2006.01) |

(52) U.S. Cl.
CPC .. *H01L 21/31144* (2013.01); *H01L 21/76804* (2013.01); *H01L 21/76805* (2013.01); *H01L 21/76807* (2013.01); *H01L 21/76811* (2013.01); *H01L 21/76813* (2013.01); *H01L 21/76816* (2013.01); *H01L 23/5226* (2013.01); *H01L 23/5329* (2013.01); *H01L 23/53295* (2013.01); *H01L 2924/0002* (2013.01)

(58) Field of Classification Search
CPC ......... H01L 21/76804; H01L 21/76805; H01L 21/76807; H01L 21/76811; H01L 21/76813
USPC ........ 438/637–640, 669, 671, 673, 700–702, 438/734, 736–738
See application file for complete search history.

(56) References Cited

U.S. PATENT DOCUMENTS

| | | | | |
|---|---|---|---|---|
| 5,173,442 A | * | 12/1992 | Carey | ............... H01L 21/31144 216/18 |
| 6,846,741 B2 | * | 1/2005 | Cooney, III | ...... H01L 21/76811 257/E21.579 |
| 7,030,028 B2 | * | 4/2006 | Mori | ................. H01L 21/31138 257/E21.256 |
| 7,727,708 B2 | | 6/2010 | Colburn et al. | |
| 8,455,348 B2 | * | 6/2013 | Yonekura | ............ H01L 21/0332 438/626 |

FOREIGN PATENT DOCUMENTS

CN         1988130 A      6/2007

* cited by examiner

*Primary Examiner* — Matthew E Warren
(74) *Attorney, Agent, or Firm* — Slater Matsil, LLP

(57) ABSTRACT

A method of forming a semiconductor device is provided. Metallic interconnects are formed in a dielectric layer of the semiconductor device. A hard mask is used to avoid usual problems faced by manufacturers, such as possibility of bridging different conductive elements and via patterning problems when there are overlays between vias and trenches. The hard mask is etched multiple times to extend via landing windows, while keeping distance between the conductive elements to avoid the bridging problem.

20 Claims, 8 Drawing Sheets

INTERCONNECT STRUCTURE AND METHOD OF FORMING SAME

TECHNICAL FIELD

The present invention relates generally to a system and method of manufacturing semiconductor devices, and, in particular embodiments, to a system and method for fabricating metallic interconnects in semiconductor devices.

BACKGROUND

Semiconductor manufacturers face an everlasting quest to comply with Moore's Law. They constantly strive to continually decrease feature sizes, such as active and passive devices, interconnecting wire widths and thicknesses and power consumption. In addition, tremendous effort is made to increase device density, wire density and operating frequencies.

These challenges have led the semiconductor industry to devise several breakthroughs for manufacturing different logic circuits, such as microprocessors and random access memory chips. Currently, the industry faces the challenge to come up with better interconnects and dielectrics to remedy the bottleneck for device functionality. For the interconnects, manufacturers utilize metals with better electrical and thermal conductivity. For example, copper wiring in place of those based on aluminum and aluminum alloys. Copper, which has a lower resistivity, greater thermal conductivity and a greater electro-migration lifetime eliminates many of the problems associated with aluminum and is more suitable for use in low-power, low-voltage and high speed applications. However, there are difficulties with fabricating copper interconnects. Because of the lack of volatile copper compounds, copper could not be patterned by the previous techniques of photoresist masking and plasma etching that had been used with great success with aluminum. Moreover, the copper can diffuse through many dielectric materials complicating the fabrication process of copper wiring. The manufacturers had to invent a radically new patterning process, which lead to the introduction of the so called damascene and dual damascene processes. During a damascene process, dielectrics are patterned using traditional methods to define trenches and vias. Then copper is deposited using electroplating and the excess is subsequently removed by chemical mechanical planarization.

Another approach is to improve the functionality of devices was the introduction of low-K dielectrics. In this type of dielectrics the dielectric constant reduction is achieved by reducing polarizability, by reducing density, or by introducing porosity, or any combination thereof. This poses further integration challenges to manufacturers, since the reduction of the dielectric constant is usually achieved at the expense of useful material properties required for metallic interconnect fabrication.

Therefore, there is a need for improved methods of fabrication of metallic interconnect wiring in low-K dielectrics, which resolve certain challenges faced by the semiconductor industry.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Methods for forming metal features in metallization layers of integrated circuits are provided. The intermediate stages of manufacturing embodiments are illustrated.

Figure 1A:
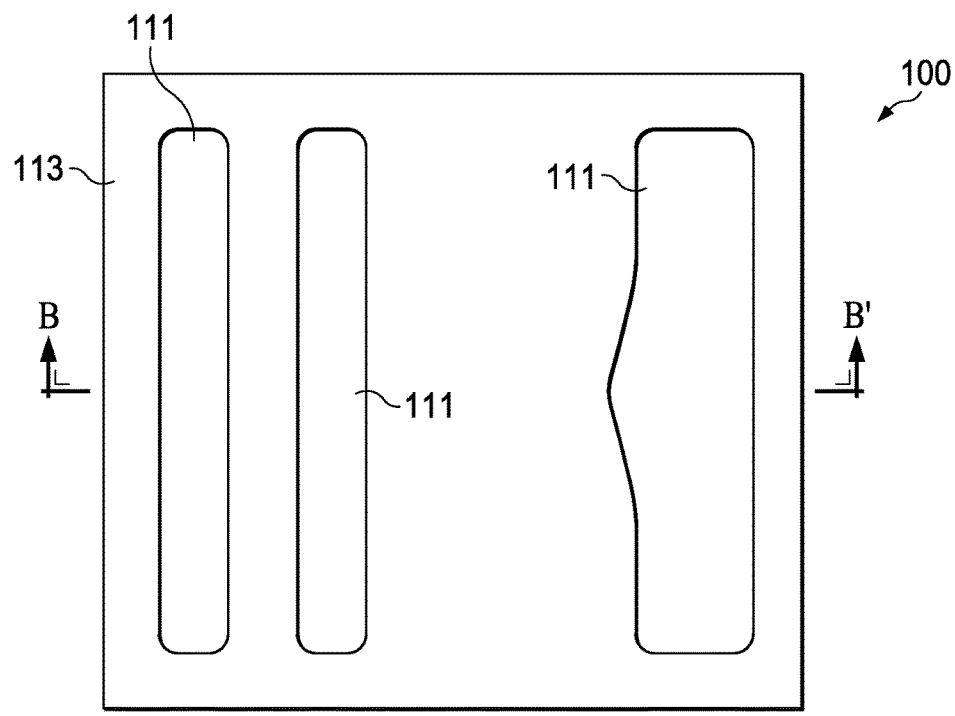
FIGS. 1(A)-7(B) are simplified top and cross-sectional views illustrating a semiconductor device fabrication process in accordance with an embodiment.
Figure 1B:
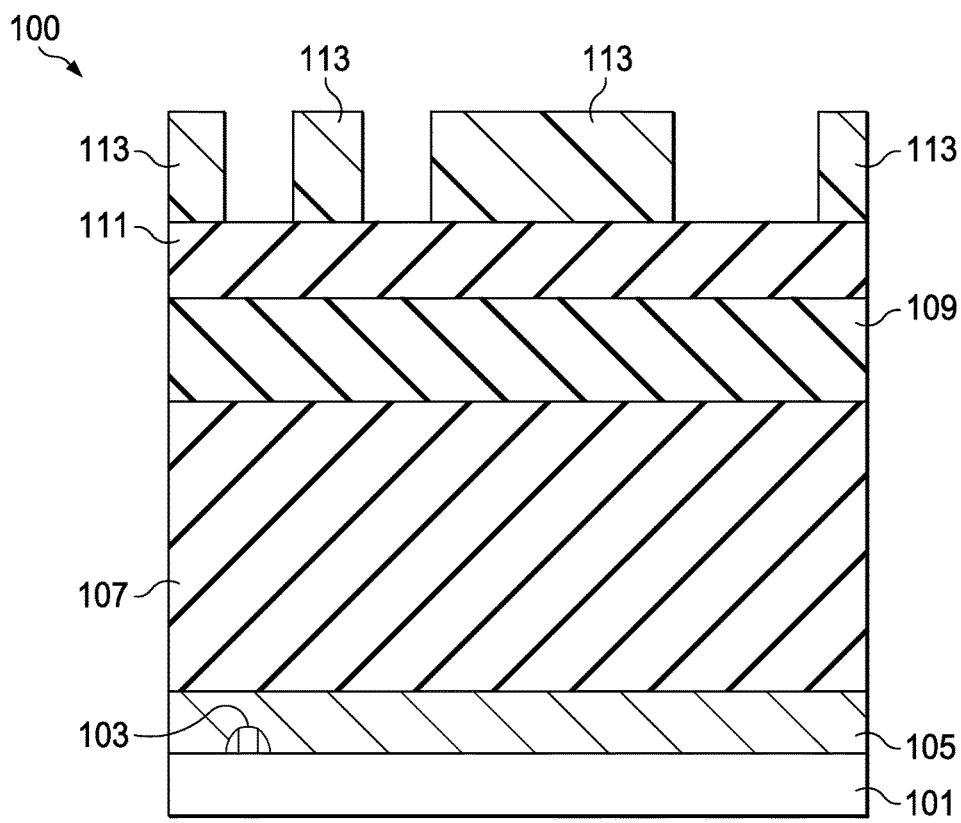

With reference to FIGS. 1(A) and 1(B), there are shown top and partial cross-sectional views (through the line BB' in FIG. 1(A)), respectively, of a semiconductor device 100. The semiconductor device 100 may include a substrate 101, devices 103 on the substrate, metallization layers 105 over the devices 103, a first dielectric layer 107 over the metallization layers 105, a second dielectric layer 109 over the first dielectric layer 107, a hard mask layer 111 over the second dielectric layer 109, and a first photoresist layer 113 over the hard mask layer 111. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The devices 103 are represented in FIG. 1(B) as a single transistor. However, the devices 103 may comprise a wide variety of active and/or passive devices such as transistors, diodes, capacitors, resistors, inductors and the like, which may be used to generate the desired structural and functional requirements of the design for the semiconductor device 100. The devices 103 may be formed using any suitable methods either within or on the surface of the substrate 101. One of ordinary skill in the art will appreciate that the above examples are provided for illustrative purposes only to further explain applications of some illustrative embodiments and are not meant to limit the disclosure in any manner.

The metallization layers 105 are formed over the substrate 101 and the devices 103 and are designed to connect the various devices 103 to form functional circuitry. While illustrated in FIG. 1(B) as a single layer, the metallization layers 105 are formed of alternating layers of dielectric and conductive material and may be formed through any suitable process (such as deposition, damascene, dual damascene, etc.). The precise number of metallization layers 105 is dependent upon the design of the semiconductor device 100.

The first dielectric layer 107 may comprise silicon dioxide, low-K dielectric materials (materials having a dielectric constant lower than silicon dioxide), such as silicon oxynitride, phosphosilicate glass (PSG), borophosphosilicate glass (BPSG), fluorinated silicate glass (FSG), organosilicate glasses (OSG), $SiO_xC_y$, Spin-On-Glass, Spin-On-Polymers, silicon carbon material, compounds thereof, composites thereof, combinations thereof, or the like, deposited by any suitable method, such as spin-on, chemical vapor deposition (CVD), and plasma-enhanced CVD (PECVD), or the like. Porous versions of the above materials may also be used. These materials and processes are provided as examples and other materials and processes may be used. The first dielectric layer 107 may act as an interlayer dielectric (ILD) in accordance with an embodiment. The first dielectric layer 107 may be formed to a thickness of between about 50 nm and about 900 nm, such as about 100 nm.

The second dielectric layer 109 may act as a cap or an etch stop layer (ESL) in accordance with an embodiment. Generally, etch stop layers provide a mechanism to stop an etching process when forming vias and/or contacts. In an embodiment, the second dielectric layer 109 is formed of a dielectric material having a different etch selectivity from adjacent layers, for example, the hard mask layer 111 (described below). The second dielectric layer 109 may comprise SiN, SiCN, SiCO, CN, combinations thereof, or the like, deposited by CVD, PECVD, or the like techniques. The second dielectric layer 109 may be formed to a thickness of between about 5 nm and about 100 nm, such as about 45 nm.

The hard mask layer 111 is used as an aid in an etching process (described below with respect to FIGS. 7(A) and 7(B)). In an embodiment, the hard mask layer 111 may comprise a nitride (e.g., silicon oxynitride or silicon nitride), a metal (e.g., titanium nitride or titanium oxide), combination of these, or the like. The hard mask layer 111 may be formed by any suitable process such as CVD, low pressure CVD, PECVD, physical vapor deposition (PVD), or the like. The hard mask layer 111 may be formed to a thickness of between about 5 nm and about 50 nm, such as about 20 nm.

The first photoresist layer 113 is used to form a pattern to be transferred to the hard mask layer 111. In an embodiment, the first photoresist layer 113 is formed and patterned by initially disposing the first photoresist layer 113 over the hard mask layer 111, which may then be exposed to a patterned radiation such as ultraviolet light or an excimer laser through a reticle (not shown). A bake or cure operation may be performed, and a developer may be used to remove either the exposed or unexposed portions of the first photoresist layer 113 depending on whether a positive or negative resist is desired. Thus, a pattern that will be used to form trenches in the semiconductor device 100 is formed in the first photoresist layer 113. The specific pattern of the first photoresist layer 113, as described herein, is for illustrative purposes only, and other patterns may be formed depending on the design of the semiconductor device 100.

Figure 2A:
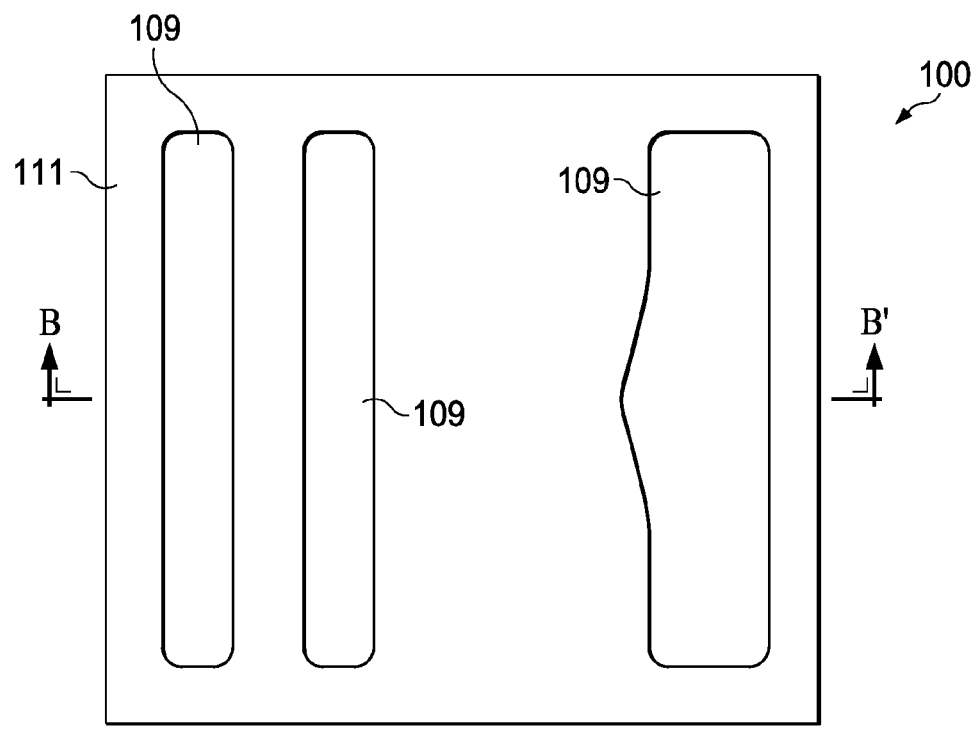
Figure 2B:
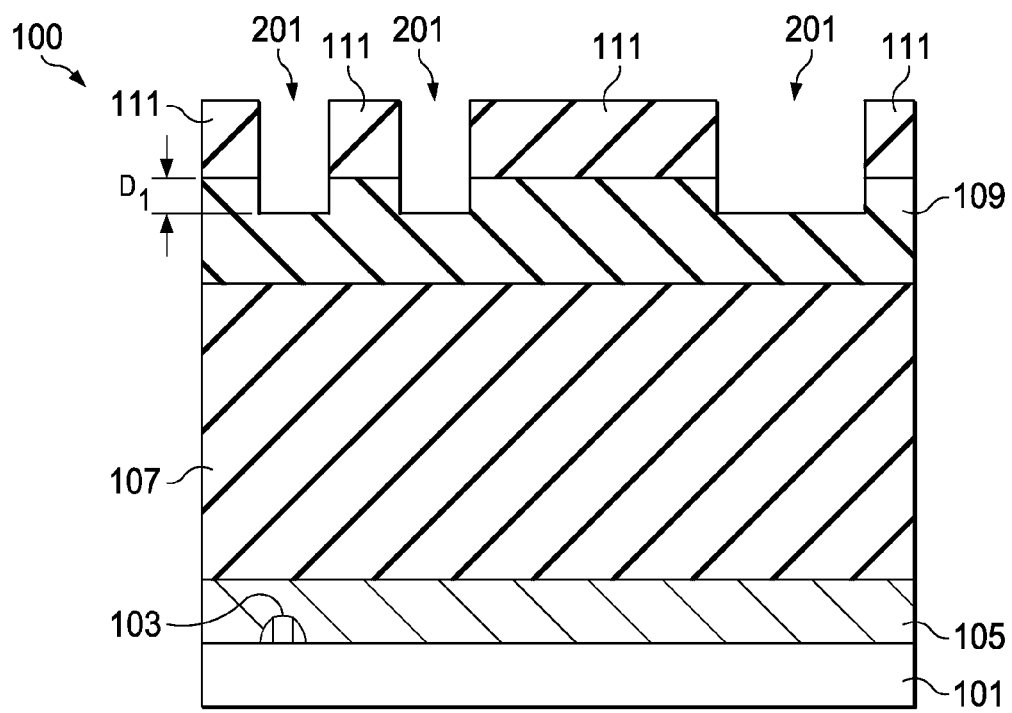

With reference to FIGS. 2(A) and 2(B), the hard mask layer 111 is etched for a first time, for example, by an anisotropic dry etch process to remove exposed portions of the hard mask layer 111. Such etching further forms a first recess 201 in the second dielectric layer 109 in a similar pattern as the first photoresist layer 113. In an embodiment, the first recess 201 is formed to a first depth $D_1$ of between about 1 nm and about 30 nm, such as about 5 nm. In an embodiment, the hard mask layer 111 may have a first etch selectivity relative to the second dielectric layer 109 of between about 2 and about 10, such as about 4. Subsequently, the first photoresist layer 113 is removed using, for example, an ashing process in combination with a wet clean process.

Figure 3A:
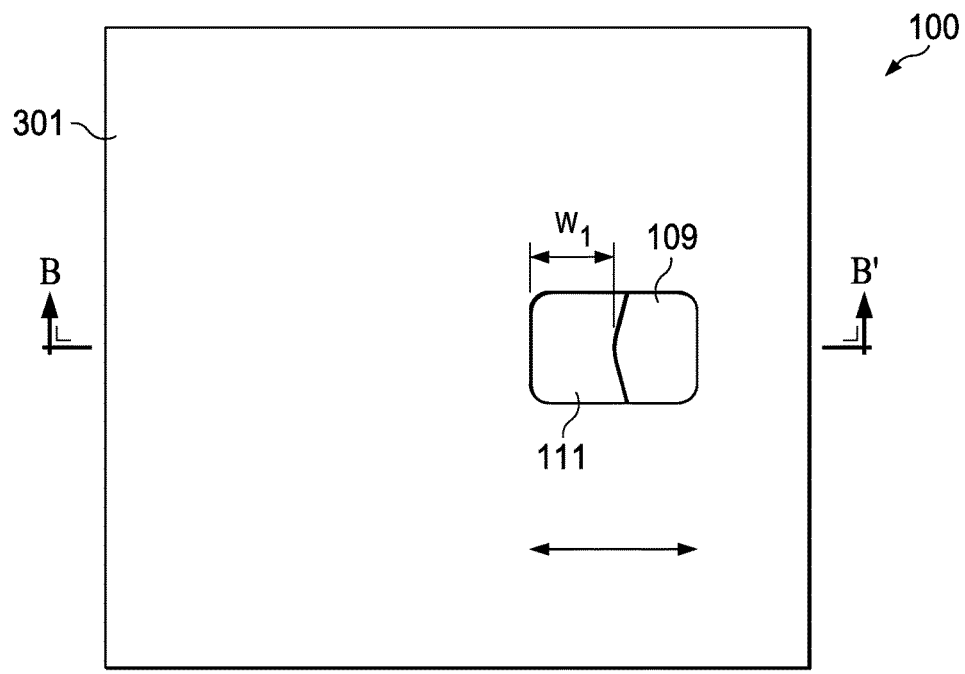
Figure 3B:
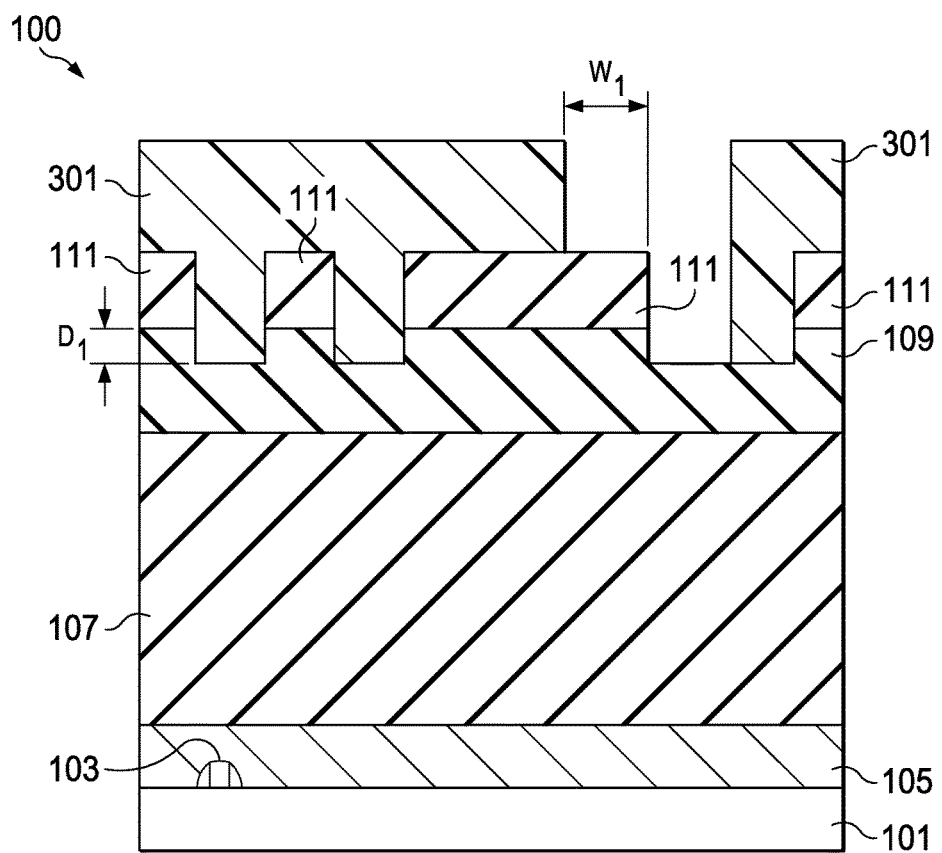

With reference to FIGS. 3(A) and 3(B), a second photoresist layer 301 is deposited on the semiconductor device 100 for a second etch of the hard mask layer 111 to expand a via landing window within the second dielectric layer 109. The second photoresist layer 301 is deposited, exposed, and developed to form patterns in the hard mask layer 111 for removing a portion of the hard mask layer 111 with a first width $W_1$ of between about 7 nm and about 100 nm, such as about 23 nm. However, the first width $W_1$, as described above, is only intended to be an illustrative embodiment.

In another embodiment, the first width $W_1$ may be determined using, for example, a computer simulation. For example, once the pattern for the first photoresist layer 113 has been designed, modeling may be performed to ensure that the process meets the desired design specifications. If it does not, for example by having a smaller than desired via landing window, then the second photoresist layer 301 may be designed and included in the process to mitigate any negative impacts from the original design for the first photoresist layer 113.

Figure 4A:
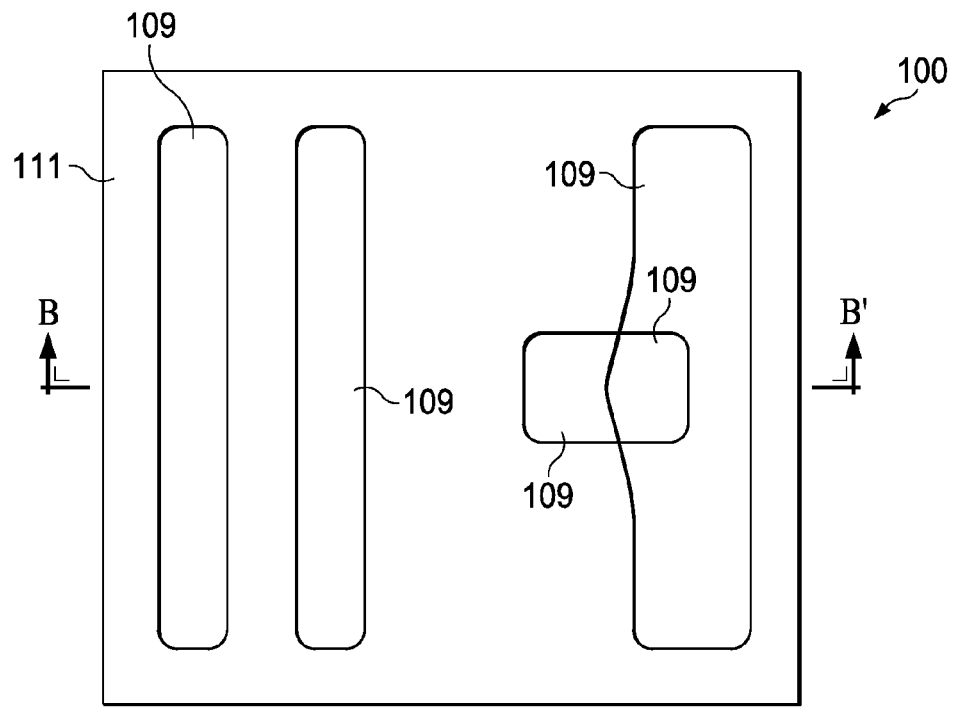
Figure 4B:
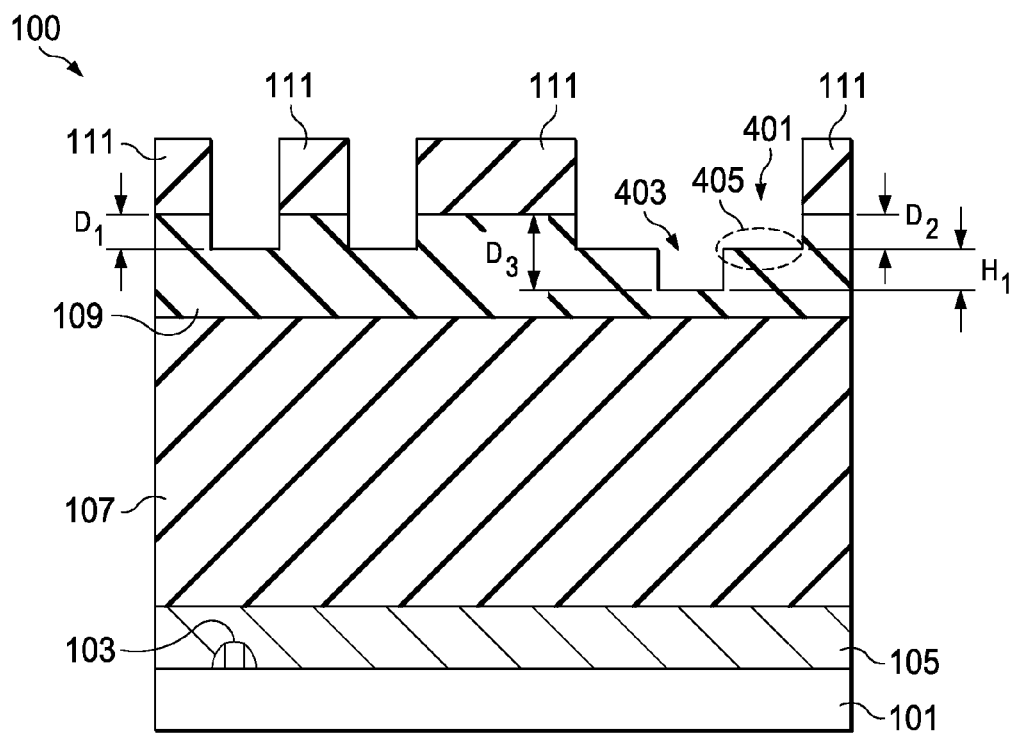

FIGS. 4(A) and 4(B) illustrate that after the second photoresist layer 301 is exposed and developed, the hard mask layer 111 is etched for the second time to widen the via landing area. The second etch process may be an anisotropic dry etch process or similar for etching both the hard mask layer 111 and the second dielectric layer 109. In an embodiment, a second recess 401, a third recess 403, and a first step 405 (between the second recess 401 and the third recess 403) are formed in the second dielectric layer 109. The second recess 401 in the second dielectric layer 109 is formed to a second depth $D_2$ of between about 1 nm and about 30 nm, such as about 5 nm, and the third recess 403 in the second dielectric layer 109 is formed to a third depth $D_3$ of between about 2 nm and about 60 nm, such as about 10 nm.

The first step 405 in the second dielectric layer 109 is formed to a first height $H_1$. The first height $H_1$ is equal to a difference between the third depth $D_3$ and the second depth $D_2$, and may be between about 1 nm and about 30 nm, such as about 5 nm. In an embodiment, the second etch of the hard mask layer 111 is performed during a second etch time $t_2$, which is less than, equal to, or more than the first etch time $t_1$. Subsequently, the second photoresist layer 301 is removed using, for example, an ashing process in combination with a wet clean process.

Figure 5A:
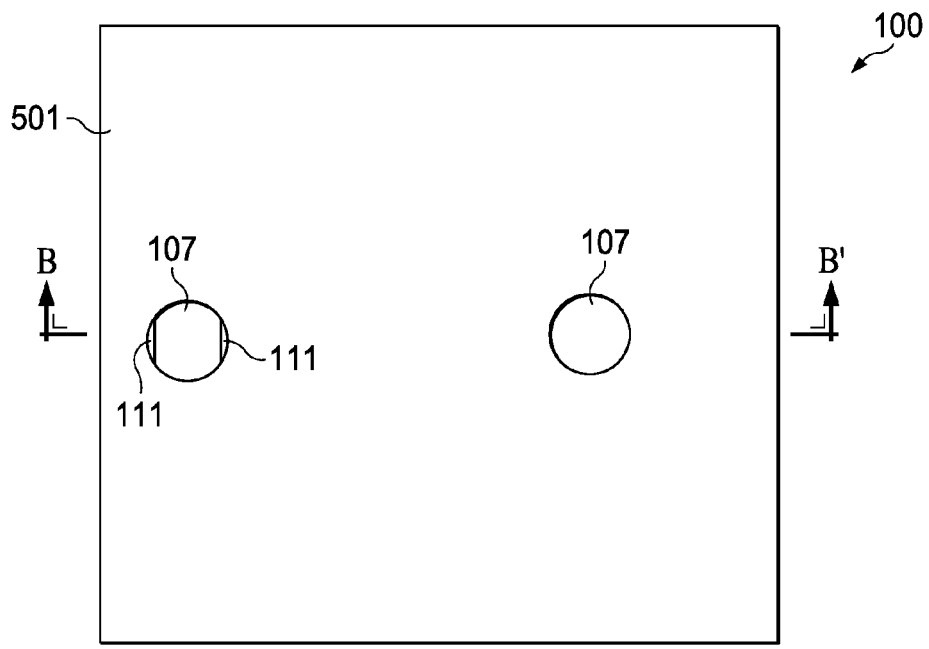
Figure 5B:
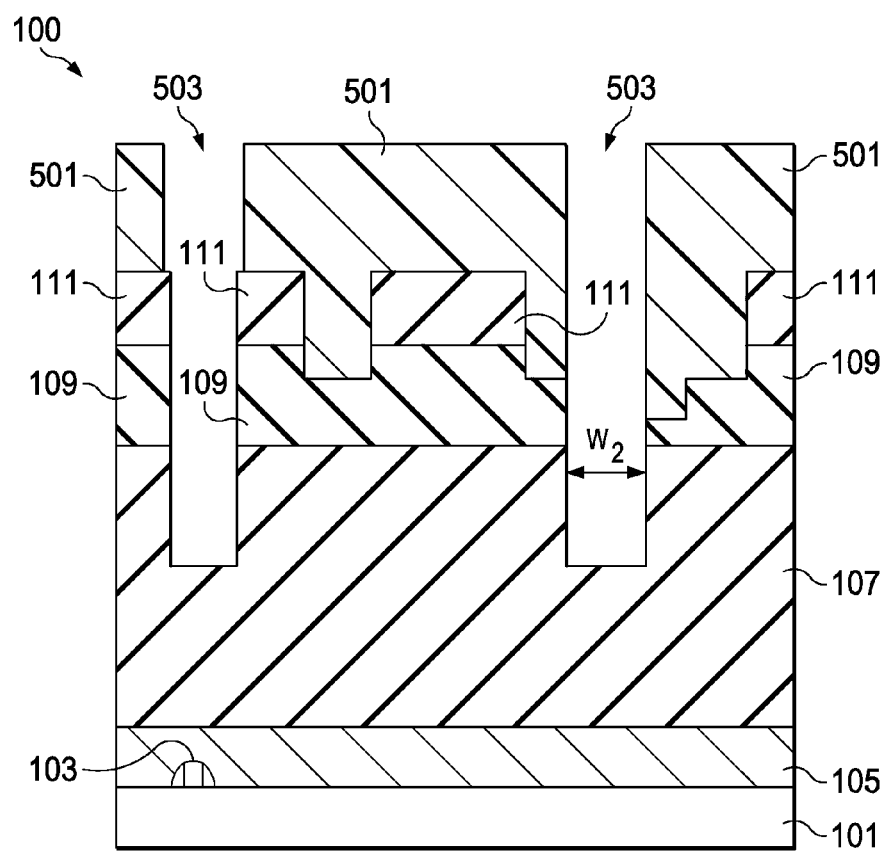

FIGS. 5(A) and 5(B) illustrate the placement of a third photoresist layer 501. The third photoresist layer 501 is patterned, exposed, and developed to assist in the patterning of via openings 503 in the first dielectric layer 107. Additionally, with the widening of the hard mask layer 111 (described above with respect to the FIGS. 3(A)-3(b)) the vias may be formed to a second width $W_2$ of between about 10 nm and about 70 nm, such as about 23 nm. The particular pattern of the third photoresist layer 501, which is shown in FIG. 5(A), is provided for illustrative purposes only to further explain applications of some illustrative embodiments and is not meant to limit the disclosure in any manner.

The second dielectric layer 109 and the first dielectric layer 107 are etched to pattern the via openings 503 in the first dielectric layer 107. In an embodiment, the etch process may stop inside the first dielectric layer 107 as shown in FIG. 5(B). In another embodiment, the etch process may continue until the metallization layers 105 are reached.

Subsequently, the third photoresist layer 501 is removed using, for example, an ashing process in combination with a wet clean process.

Figure 6A:
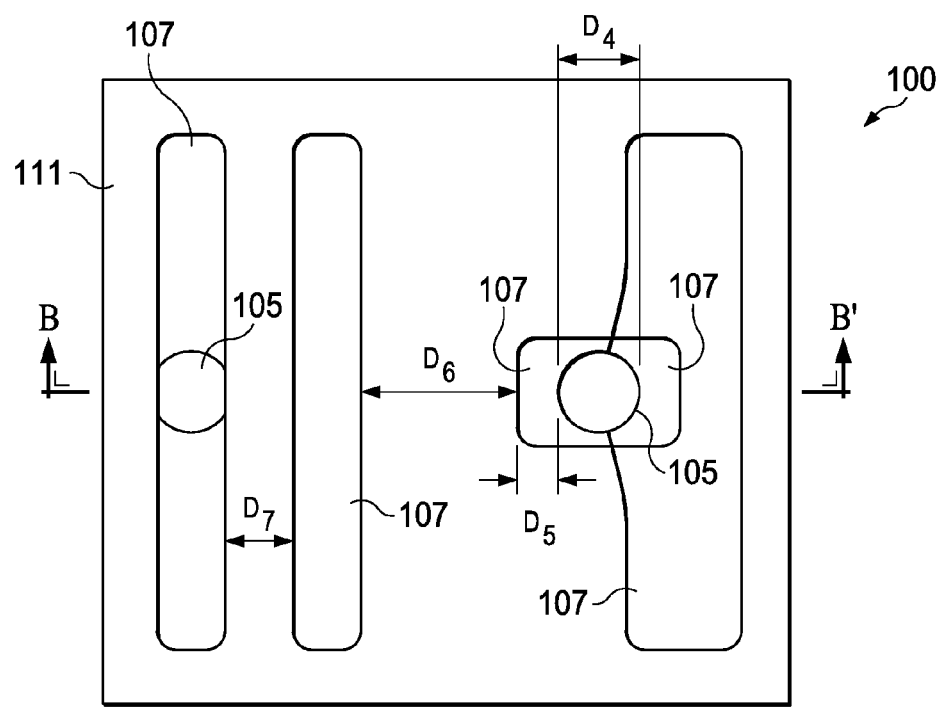
Figure 6B:
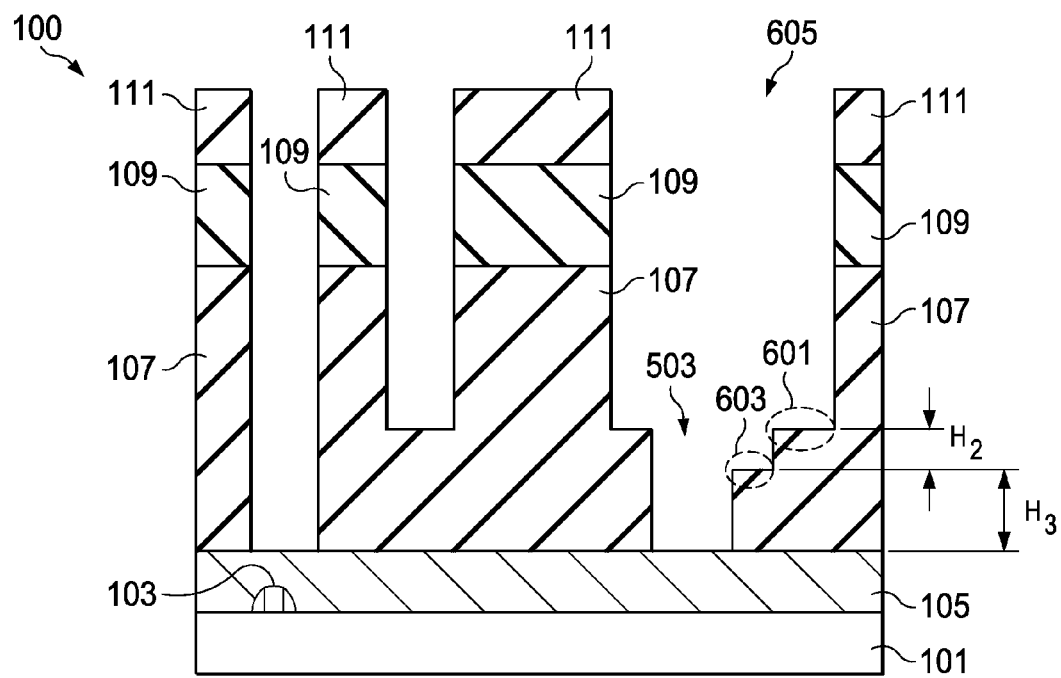

FIGS. 6(A) and 6(B) illustrate a use of the widened hard mask layer 111 during a subsequent etching process to extend the via openings 503 and to expose a conductive region of the metallization layers 105. Due to high etching selectivity of the hard mask layer 111, the first dielectric layer 107 and the second dielectric layer 109 may be etched without a significant change in the hard mask layer 111. Additionally, in the same etching process, the second dielectric layer 109 and the first dielectric layer 107 are etched to pattern trench openings 605 in the first dielectric layer 107. The first dielectric layer 107 is etched until the metallization layers 105 are reached. The etch selectivity of the first dielectric layer 107 relative to the second dielectric layer 109 may be between about 1 and about 4, such as about 2.

FIG. 6(B) further illustrates a transfer of the first step 405 in the second dielectric layer 109, which is shown in FIG. 4(B), to a second step 601 in the first dielectric layer 107 during the etch process. In addition, a third step 603 is formed in the first dielectric layer 107 during the etch process, as illustrated in FIG. 6(B). The second step 601 in the first dielectric layer 107 is formed to a second height $H_2$ of between about 5 nm and about 50 nm, such as 13 nm. The third step 603 in the first dielectric layer 107 is formed to a third height $H_3$ of between about 20 nm and about 100 nm, such as 80 nm.

FIG. 6(A) further illustrates spacings for openings in the hard mask layer 111. In an embodiment, these spacings may be used to determine minima and maxima spacings in the hard mask layer 111. For example, a minima spacing dimension of the hard mask layer 111 can be determined by adding a via critical dimension $D_4$ to a desired overlayer specification $D_5$. In a particular embodiment, the via critical dimension $D_4$ may be between about 10 nm and about 90 nm, such as about 23 nm, and the overlayer specification $D_5$ may be between about 0 nm and about 15 nm, such as about 6 nm. As such, the minima spacing dimension is dependent, at least in part, on the manufacturing technologies. In an embodiment, the minima spacing dimension of the hard mask layer 111 may be between about 10 nm and about 50 nm, such as about 35 nm. A maxima spacing dimension of the hard mask layer 111 can be determined by the condition to keep an extra mask spacing dimension $D_6$ greater or equal to a half pitch dimension $D_7$ between openings on the hard mask layer 111. The extra mask spacing dimension $D_6$ may be between about 7 nm and about 100 nm, such as about 23 nm, and the half pitch dimension $D_7$ may be between about 5 nm and about 40 nm, such as about 23 nm. As such, the maxima spacing is dependent, at least in part, on the manufacturing technologies. In an embodiment, the maxima spacing dimension of the hard mask layer 111 may be between about 7 nm and about 100 nm, such as about 23 nm.

Figure 7A:
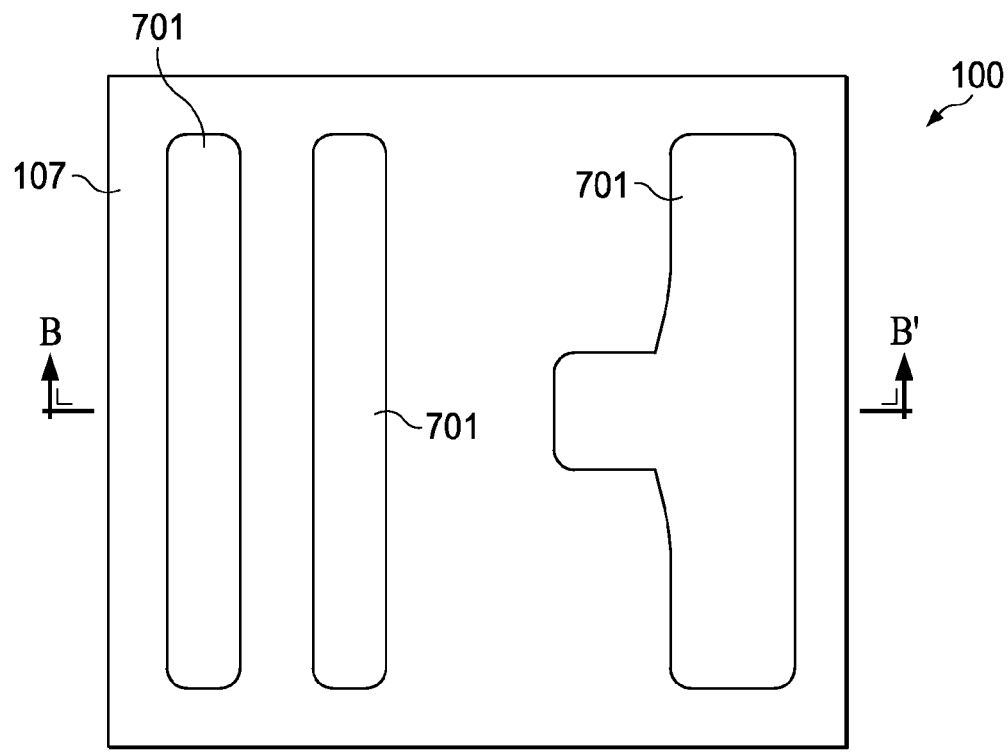
Figure 7B:
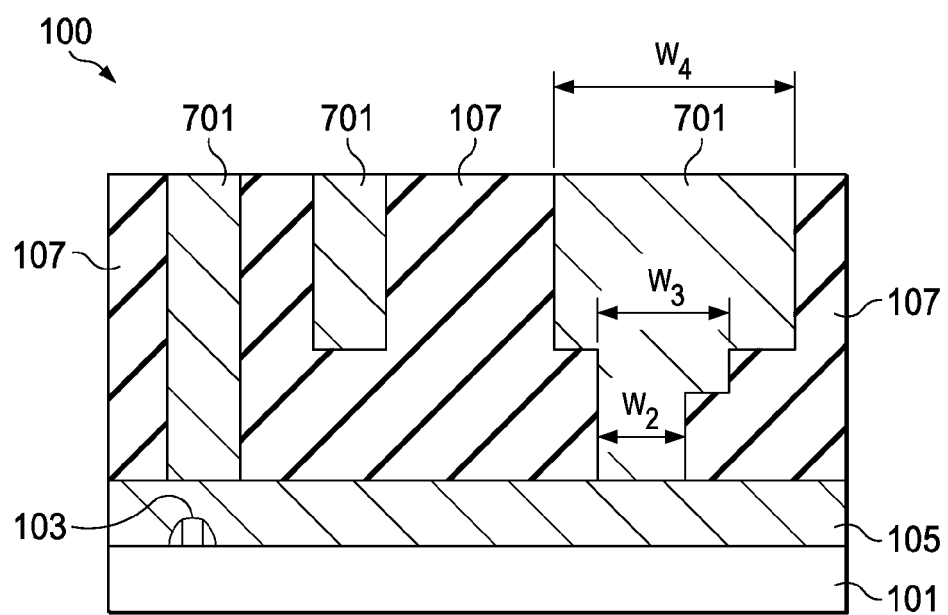

FIGS. 7(A) and 7(B) illustrate conductive elements 701 that are formed in the first dielectric layer 107. In addition, the conductive elements 701 may include one or more barrier/adhesion layers (not shown) to protect the first dielectric layer 107 from diffusion and metallic poisoning. The barrier layer may comprise titanium, titanium nitride, tantalum, tantalum nitride, or other alternatives. The barrier layer may be formed using PVD, CVD, or the like. The thickness of the barrier layer may be between about 20 Å and about 200 Å. One skilled in the art will realize, however, that the dimensions recited throughout the description are related to the formation technology used for forming the integrated circuits, and will reduce with the scaling of the formation technology.

The material of the conductive elements 701 may comprise copper or a copper alloy. However, the conductive elements 701 may comprise other conductive materials, such as silver, gold, tungsten, aluminum, and the like. In an embodiment, the steps for forming the barrier layer and the conductive elements 701 may include blanket forming barrier layer, depositing a thin seed layer of a conductive material, and filling trenches and vias with the conductive material, for example, by plating. A chemical mechanical planarization (CMP) is then performed to remove excess barrier layer and the conductive material.

In the embodiment described above, the hard mask layer 111 is widened with a second etch. The modified hard mask layer 111 may be used to improve the performance of the semiconductor device 100. In particular, the widened hard mask layer 111 may improve via open performance and keep the leakage window open while avoiding possible developments of a bridge between different conductive elements, because of weak photoresists during manufacturing.

In further reference to FIG. 7(B), one or more of the conductive elements 701 may be formed to have the second width $W_2$, a third width $W_3$ and a fourth width $W_4$. In an embodiment, the third width $W_3$ may be between about 10 nm and about 120 nm, such as about 20 nm, and the fourth width $W_4$ may be between about 7 nm and about 120 nm, such as about 40 nm.

Figure 8:
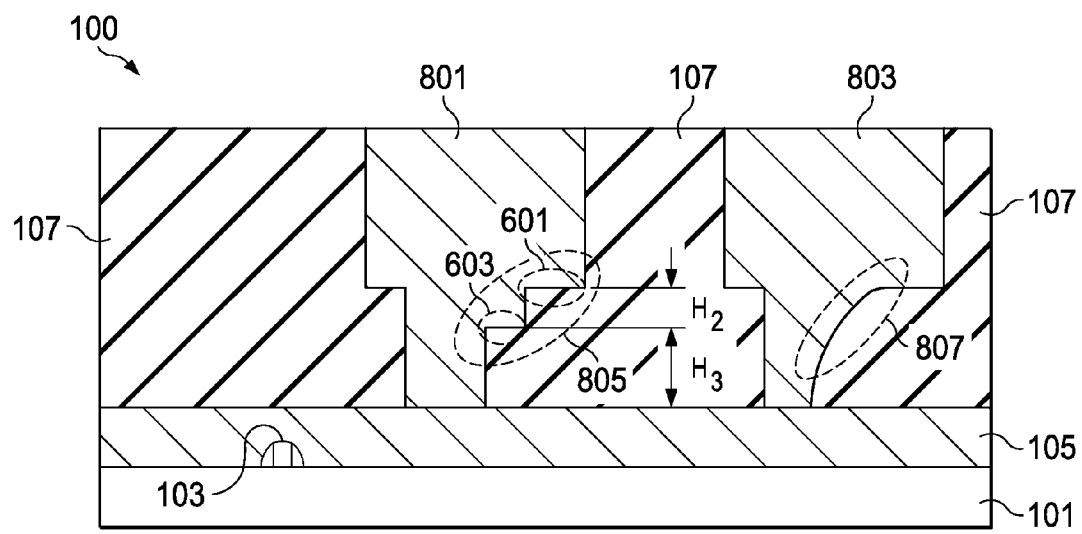
FIG. 8 is a simplified partial cross-sectional view illustrating a semiconductor device structure in accordance with an embodiment.

FIG. 8 illustrates an embodiment with a first conductive element 801 and a second conductive element 803. In this embodiment, the first conductive element 801 is formed in accordance with the steps described above with respect to FIGS. 1(A)-7(B). In particular, the first conductive element 801 was formed with the double etch of the hard mask layer 111, as described above with respect to FIGS. 1(A)-4(B). As such, a first sidewall 805 of the first conductive element 801 shows the second step 601 with the second height $H_2$ and the third step 603 with the third height $H_3$. Thus, the first sidewall 805 of the first conductive element 801 shows a double-step structure.

FIG. 8 further illustrates that the second conductive element 803 is not formed with the double etch of the hard mask layer 111. Rather, after the first etch of the hard mask layer 111, as described above with respect to FIGS. 1(A)-2(B), the via etch is performed through the second dielectric layer 109 and the first dielectric layer 107 without widening of the hard mask layer 111 for the second conductive element 803. A second sidewall 807 of the second conductive element 803 shows a smooth transition from a trench sidewall to a via sidewall. From this transition, the second sidewall 807 of the second conductive element 803 has a single-step structure.

In an embodiment, a semiconductor device comprises a substrate, and a first conductive element over the substrate, the first conductive element comprising a first sidewall with a double-step structure. The first conductive element may further comprise a second sidewall with a single-step structure.

In an embodiment, a semiconductor device comprises a substrate, a dielectric layer over the substrate, and a first conductive element in the dielectric layer. The first conductive element may have a first width, a second width, and a third width. The first width, the second width, and the third width are different from each other.

In an embodiment, a method for forming the semiconductor device comprises disposing a hard mask layer over a second dielectric layer, and the second dielectric layer over a first dielectric layer, and subsequently performing a first etch of the hard mask layer to remove a portion of the hard mask layer and form first openings. A second etch of the hard mask layer is preformed to widen the first openings in the hard mask layer and form a widened hard mask layer. A third etch is performed, wherein the second dielectric layer and the first dielectric layer are etched to form second openings in the first dielectric layer. A fourth etch is performed, wherein the second dielectric layer and the first dielectric layer are etched using the widened hard mask layer to form third openings in the first dielectric layer. Subsequently, conductive elements are formed in the third openings of the first dielectric layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a semiconductor device, the method comprising:
   forming a first dielectric layer over a substrate;
   forming a second dielectric layer over the first dielectric layer;
   forming a mask layer over the second dielectric layer;
   patterning the mask layer to form a patterned mask layer, the patterned mask layer having a first opening therein, the patterning forming a first recess in the second dielectric layer;
   patterning the patterned mask layer to widen the first opening, the patterning forming a second recess and a third recess in the second dielectric layer, the third recess being formed within the first recess, the third recess having a depth greater than the first recess and the second recess;
   forming a fourth recess at least partially overlapping the third recess, the fourth recess extending into the first dielectric layer;
   extending the first recess, the second recess, and the third recess into the first dielectric layer and extending the fourth recess through the first dielectric layer, thereby forming a second opening in the first dielectric layer; and
   forming a conductive feature in the second opening in the first dielectric layer.

2. The method of claim 1, wherein the second recess has a depth different than the first recess.

3. The method of claim 1, wherein the second opening has a sidewall, at least a first portion of the sidewall having a single step.

4. The method of claim 3, wherein at least a second portion of the sidewall has a double step.

5. The method of claim 1, wherein forming the fourth recess comprises:
   forming a photoresist layer over the patterned mask layer; and
   patterning the photoresist layer to form a third opening in the photoresist layer, the third opening at least partially overlapping with the third recess.

6. The method of claim 1, wherein patterning the patterned mask layer comprises:
   forming a photoresist layer over the patterned mask layer; and
   patterning the photoresist layer to form a third opening in the photoresist layer, the third opening at least partially overlapping with the first opening.

7. The method of claim 1, wherein the fourth recess is between the second recess and the third recess.

8. The method of claim 1, wherein patterning the patterned mask layer to widen the first opening comprises depositing a first photoresist mask after patterning the mask layer to form the patterned mask layer.

9. The method of claim 1 further comprising:
   forming a fifth recess extending into the second dielectric layer while forming the first recess; and
   extending the fifth recess into the first dielectric layer while forming the second opening, wherein the second opening extends further into the first dielectric layer than the fifth recess.

10. A method for forming a semiconductor device, the method comprising:
    forming a first dielectric layer over a substrate;
    forming a second dielectric layer over the first dielectric layer;
    forming a mask layer over the second dielectric layer;
    patterning the mask layer to form a patterned mask layer, the patterned mask layer having a first opening therein, the patterning forming a first recess in the second dielectric layer;
    patterning the patterned mask layer to widen the first opening, the patterning forming a second recess and a third recess in the second dielectric layer, the third recess being formed within the first recess, the third recess having a depth greater than the first recess and the second recess, and wherein patterning the patterned mask layer to widen the first opening comprises depositing a first photoresist mask after patterning the mask layer to form the patterned mask layer;
    forming a fourth recess at least partially overlapping the third recess, the fourth recess extending into the first dielectric layer;
    extending the first recess, the second recess, and the third recess into the first dielectric layer and extending the fourth recess through the first dielectric layer, thereby forming a second opening in the first dielectric layer; and
    forming a conductive feature in the second opening in the first dielectric layer.

11. The method of claim 10, wherein the second opening comprises:
    a first bottom surface substantially level with a bottom surface of the first dielectric layer;
    a second bottom surface above the first bottom surface; and
    a third bottom surface about the second bottom surface.

12. The method of claim 11, wherein a first distance between the first bottom surface and the second bottom surface is different than a second distance between the second bottom surface and the third bottom surface.

13. The method of claim 11, wherein a sidewall of the second opening connects the second bottom surface to the third bottom surface.

14. The method of claim 10, wherein depositing the first photoresist mask comprises depositing at least a portion of the first photoresist mask in the first opening.

15. The method of claim 10, wherein forming the fourth recess comprises depositing a second photoresist mask after forming the second recess and the third recess.

16. A method for forming a semiconductor device, the method comprising:

forming a first dielectric layer over a substrate;

forming a second dielectric layer over the first dielectric layer;

forming a mask layer over the second dielectric layer;

patterning the mask layer to form a patterned mask layer, the patterned mask layer having a first opening therein, the patterning forming a first recess in the second dielectric layer;

patterning the patterned mask layer to widen the first opening, the patterning forming a second recess and a third recess in the second dielectric layer, the third recess being formed within the first recess, the third recess having a depth greater than the first recess and the second recess;

forming a fourth recess at least partially overlapping the third recess, the fourth recess extending into the first dielectric layer;

forming a fifth recess extending into the second dielectric layer;

extending the first recess, the second recess, and the third recess into the first dielectric layer and extending the fourth recess through the first dielectric layer, thereby forming a second opening in the first dielectric layer;

extending the fifth recess into the first dielectric layer, wherein the second opening extends further into the first dielectric layer than the fifth recess; and forming a conductive feature in the second opening in the first dielectric layer.

17. The method of claim 16, wherein patterning the patterned mask layer to widen the first opening comprises depositing a photoresist mask after patterning the mask layer to form the patterned mask layer, and wherein depositing the photoresist mask comprises filling the fifth recess with the photoresist mask.

18. The method of claim 16, wherein forming the fifth recess comprises forming the fifth recess while forming the first recess.

19. The method of claim 16, wherein extending the fifth recess into the first dielectric layer comprises extending the fifth recess while forming the second opening.

20. The method of claim 16 further comprising after forming the conductive feature removing the second dielectric layer and the patterned mask layer.

* * * * *